United States Patent [19]

Ahne et al.

[11] 4,398,009

[45] Aug. 9, 1983

[54] POLYOXAZOLE PRECURSOR AND THE PREPARATION THEREOF

[75] Inventors: Hellmut Ahne, Röttenbach; Eberhard Kühn, Hemhofen; Roland Rubner, Röttenbach, all of Fed. Rep. of Germany

[73] Assignee: Siemens Aktiengesellschaft, Berlin & Munich, Fed. Rep. of Germany

[21] Appl. No.: 179,462

[22] Filed: Aug. 19, 1980

[30] Foreign Application Priority Data

Aug. 21, 1979 [DE] Fed. Rep. of Germany ....... 2933828

[51] Int. Cl.$^3$ ............................................. C08G 65/40
[52] U.S. Cl. .................................... 525/426; 428/411;
428/413; 428/474.4; 525/430; 525/445; 528/25;
528/99; 528/112; 528/113; 528/125; 528/128;
528/289; 528/297
[58] Field of Search ................. 528/99, 113, 112, 125,
528/128, 25, 289, 297; 525/426, 430, 445

[56] References Cited

U.S. PATENT DOCUMENTS 3,957,512  5/1976  Kleeberg et al. ..................... 528/99

*Primary Examiner*—Harold D. Anderson
*Attorney, Agent, or Firm*—Kenyon & Kenyon

[57] ABSTRACT

The invention relates to oligomeric and/or polymeric precursor stages of polyoxazoles, as well as to a method for the preparation of these precursor stages. New radiation-reactive polymer precursor stages are provided comprised of addition products of olefinically unsaturated monoepoxides on hydroxyl group-containing polycondensation products of aromatic and/or heterocyclic dihydroxy diamino compounds with dicarboxylic-acid chlorides or esters. The radiation-reactive precursor stages according to the invention are suitable, for example, for the preparation of highly heat-resistant relief structures and as coatings for the optical fibers of light waveguides.

6 Claims, No Drawings

POLYOXAZOLE PRECURSOR AND THE PREPARATION THEREOF

BACKGROUND OF THE INVENTION

The present invention relates to oligomeric and/or polymeric precursor stages of polyoxazoles as well as to a method for preparing these precursor stages.

Precursor stages of polymers are known, for example, from German Pat. No. 2 308 830 and its corresponding U.S. Pat. No. 3,957,512. These polymer precursor stages are polyaddition or polycondensation products of polyfunctional carbocyclic or heterocyclic compounds which carry radiation-sensitive radicals, with diamines, diisocyanates, bis-acid chlorides or dicarboxylic acids. The compounds carrying radiation-sensitive radicals contain two carboxyl, carboxylic-acid chloride, amino, isocyanate or hydroxyl groups suitable for addition or condensation reactions and radiation-reactive groups which are bound to carboxyl groups <...> partially in ortho- or peri-position thereto <in ester fashion>. The diamines, diisocyanates, bis-acid chlorides and dicarboxylic acids to be reacted with these compounds have at least one cyclic structure element.

The known polymer precursor stages serve for the preparation of protective and insulating layers, as well as the production of relief structures of highly heat-resistant polymers, into which the precursor stages are converted by exposure and, optionally, subsequent annealing. In the process, particularly polymers of the following classes of materials are obtained: Polyimides, polyamidimides, polyester imides, poly-1,3-quinazoline-2,6-diones, poly-isoindoloquinazoline diones, poly-1,3-oxazine-6-ones and polybenz-1,3-oxazine-2,4-diones.

SUMMARY OF THE INVENTION

It is an object of the present invention to provide new polymer precursor stages which broaden the spectrum of starting materials for the preparation of relief structures as well as of protective and insulating layers. In particular, it is an object of the invention to provide radiation-reactive polyoxazole precursor stages.

According to the present invention, these objects are accomplished by the provision that the precursor stages comprise addition products of olefinically unsaturated monoepoxides on hydroxyl group-containing polycondensation products of aromatic and/or heterocyclic dihydroxydiamino compounds with dicarboxylic-acid chlorides or esters.

Radiation-reactive polyoxazole precursor stages were heretofore unknown. The compounds according to the present invention, in exhibiting this radiation-reactive property, can, therefore, be cross-linked by radiation and in the process be converted into highly heat-resistant polymers with excellent properties. (See in this connection the concurrently-filed U.S. patent application "Method For The Manufacture Of Highly Heat-Resistant Relief Structures", Ser. No. 179,472 filed Aug. 19, 1980, now U.S. Pat. No. 4,332,883. In addition to their photo structurability, the compounds according to the present invention are also distinguished by high solubility in organic solvents.

The polyoxazole precursor stages according to the present invention generally have the following structure (1) or (2):

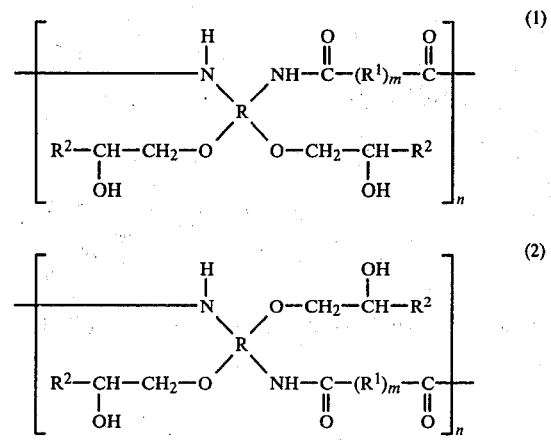

In Formula (1) and (2), n stands for an integral number from 2 to about 100 and m is 0 or 1.

The following applies to R, $R^1$ and $R^2$:

R is an optionally halogenated, at least partially aromatic and/or heterocyclic tetravalent, i.e., tetrafunctional, radical, in which two valences always are arranged adjacent to each other; if the radical R has several aromatic and/or heterocyclic structure elements, the valence pairs are located at respective end-position structure elements of this type;

$R^1$ is an optionally halogenated, divalent, i.e., difunctional, radical with aliphatic and/or cycloaliphatic structure, optionally having hetero atoms, and/or with aromatic and/or heterocyclic structure;

$R^2$ is an olefinically unsaturated radical, particularly an optionally substituted (meth)acryl-ester containing group.

The radicals R, $R^1$ and $R^2$ have in particular the following meaning:

R =

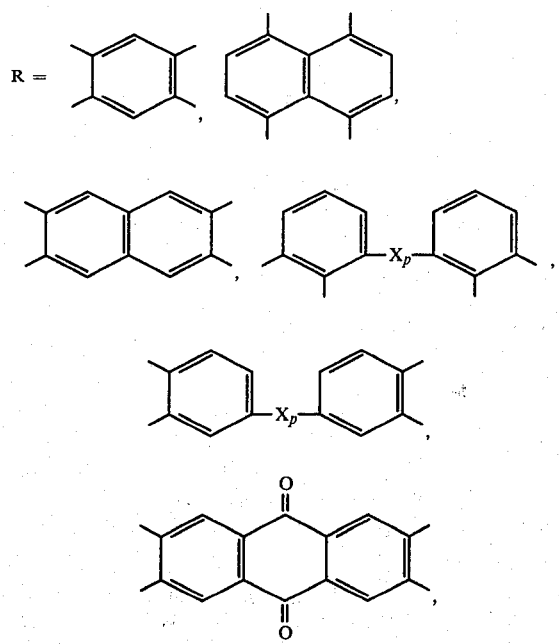

-continued
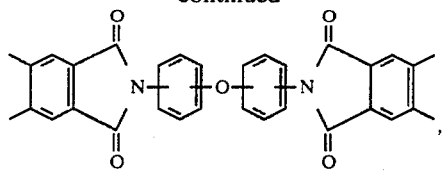
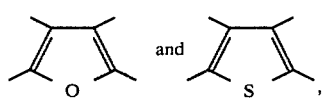 and
where p=0 or 1 and X stands for one of the following radicals:
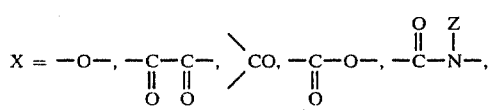
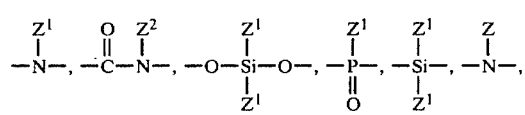
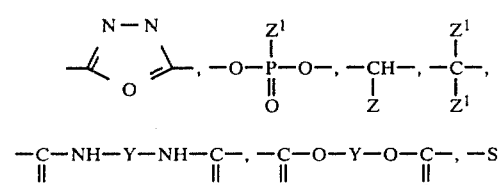
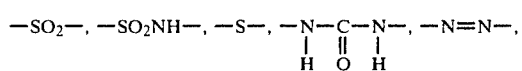
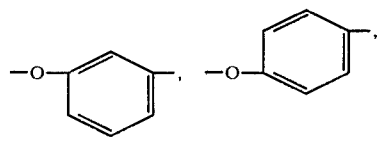
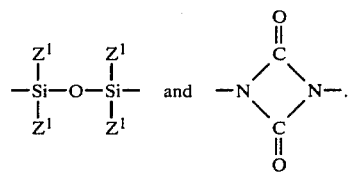
The following applies to the further radicals:
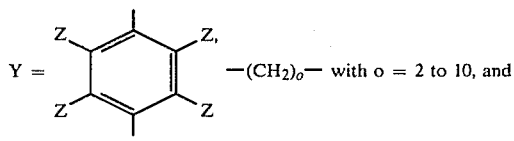 —(CH$_2$)$_o$— with o = 2 to 10, and
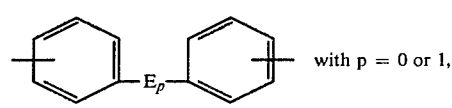 with p = 0 or 1,
Z=H or alkyl with 1 to 6 carbon atoms,
Z$^1$=alkyl with 1 to 10 carbon atoms or aryl,
Z$^2$=aryl or heteroaryl, and
E = 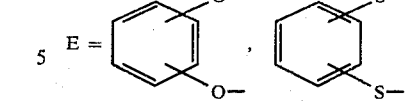
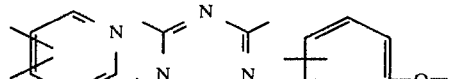
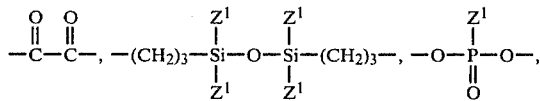
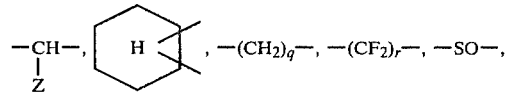
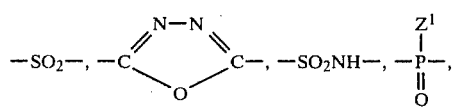
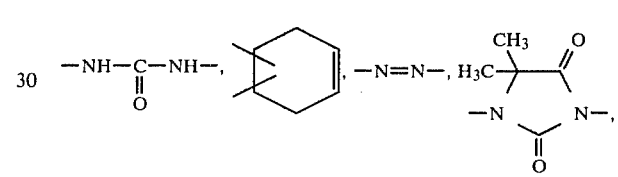
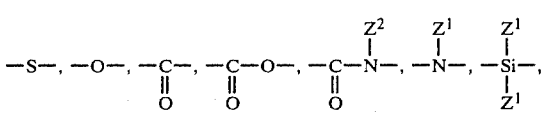
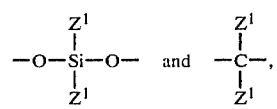
where q=2 to 14 and r=2 to 18, and Z$^1$ and Z$^2$ are as defined above.
R$^1$ = 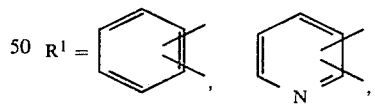
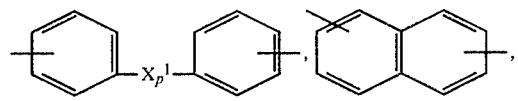
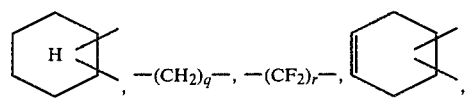
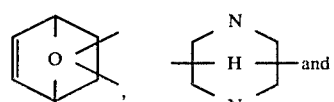

-continued

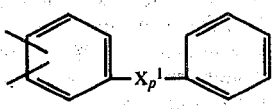

where p=0 or 1, q=2 to 14 and r=2 to 18.

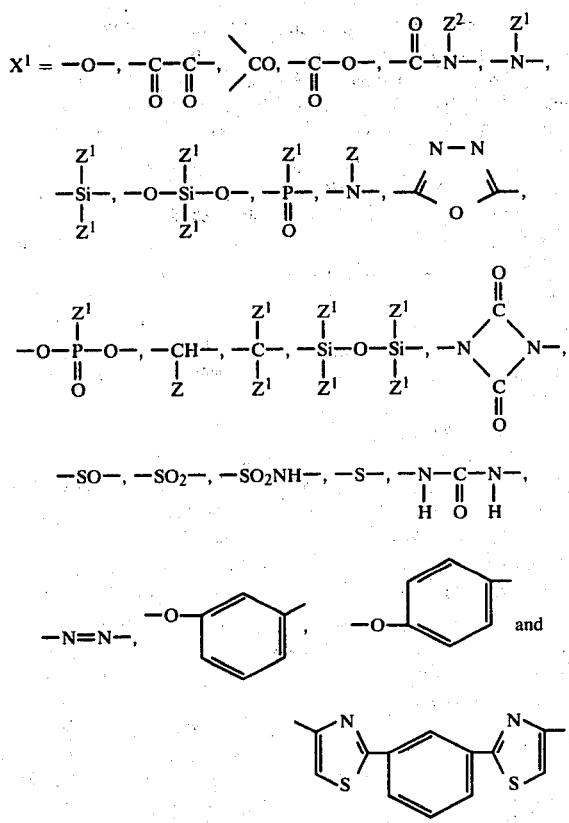

where Z, $Z^1$ and $Z^2$ are as defined above.

where s=2 to 16;

The following applies to the further radicals:
$X^2 = -CH_2-$ and $-CH_2-O-[(CH_2)_r-O]_t-(CH_2)_s-$, and
$Y^2 = -H$, $-CH_3$, $-Cl$, $-Br$, $-C \equiv N$,
where r=2 to 18, s=2 to 16 and t=0 to 10.

The polymer precursor stages according to the present invention are addition products of olefinically unsaturated monoepoxides on hydroxyl group-containing prepolymers. These prepolymers in turn are polycondensation products of dihydroxydiamino compounds and dicarboxylic-acid chlorides or esters. Due to the nature of the polycondensation reaction between these components, a given dihydroxydiamino compound and a given dicarboxylic acid will result in the same polycondensation product regardless of whether the dicarboxylic acid is used in the form of its acid chloride or ester, and regardless of the nature of the ester moiety per se. In turn, for a given olefinically unsaturated monoepoxide, a given dihydroxydiamino compound and a given dicarboxylic acid, reacted in the sequence according to the invention, the same polyoxazole precursor will be produced regardless of whether the dicarboxylic acid is used in the form of its acid chloride or its ester, and regardless of the nature of the ester moiety per se. The preferred dihydroxydiamino compound is 3,3'-dihydroxybenzidine and the preferred dicarboxylic-acid derivatives are isophthalic-acid dichloride and benzophenone dicarboxylic acid dichloride.

On the hydroxyl group-containing prepolymers, olefinically unsaturated monoepoxides are added. These epoxides have the following structure (3), where the unsaturated radical $R^2$ has the meaning given above:

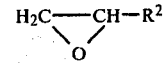

Preferred are the unsaturated epoxides glycidyl acrylate and glycidyl methacrylate.

The structure of the polyoxazole precursor stages according to the invention is illustrated as an example by means of the following Formula (4):

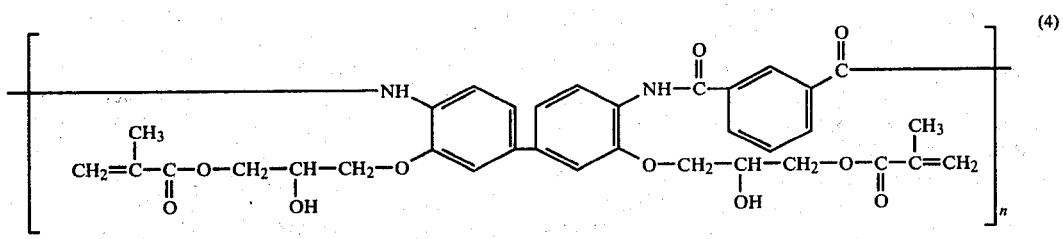

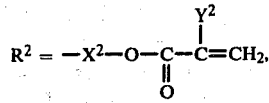

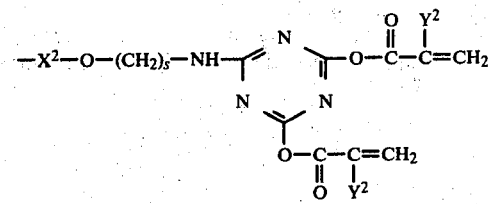

and $-X^2-O-CH_2-CH=CH_2$;

In Formula (4), the addition product of glycidyl methacrylate on the polycondensation product of 3,3'-dihydroxybenzidine and isophthalic-acid dichloride is shown.

The precursor stages according to the present invention have as their basic building block preferably aromatic dihydroxydiamino compounds and therefore yield in the thermal treatment polymers with the following structure unit (5):

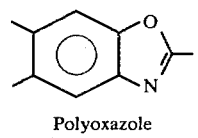

Polyoxazole (5)

The polyoxazole precursor stages according to the present invention are advantageously prepared in such a manner that an aromatic and/or heterocyclic dihydroxydiamino compound is reacted with a dicarboxylic-acid chloride or ester to yield a hydroxyl group-containing polycondensation product, and that the polycondensation product is brought to reaction with an olefinically unsaturated monoepoxide in an organic solvent, optionally in the presence of an aminic catalyst, at room temperature or at temperatures of up to about 100° C.

This method has the advantage that the preparation is simple and it proceeds at relatively low temperatures, i.e., at temperatures when no conversion of the precursor stages into insoluble cyclizing products yet takes place. The reaction products are furthermore obtained in pure condition.

In addition to their use as a photo resist and for making protective and insulating layers, where structurizing takes place, the precursor stages according to the present invention can also serve generally, in non-structured form, for the preparation of protective and insulating coatings. To particular advantage, these precursor stages can be used for the preparation of plastic coatings for the optical fibers of light waveguides.

DETAILED DESCRIPTION OF THE INVENTION

The invention is explained in further detail with the aid of the following non-limiting embodiment examples, in which the preparation of radiation-reactive polybenzoxazole precursor stages is described.

EXAMPLE I

To a solution of 6.49 parts by weight 3,3'-dihydroxybenzidine in 50 parts by volume dimethylacetamide and 9 parts by volume pyridine are added, at a temperature of −5° to −20° C., while stirring vigorously, within about 30 minutes, 6.1 parts by weight isophthalic-acid dichloride in 20 parts by volume cyclohexanone. After further stirring for 3 hours at room temperature, the viscous reaction solution is allowed to stand overnight; the solution then is added dropwise, while stirring, into 1000 parts by volume of water. The precipitated resin is separated, washed with water and methanol and dried in a vacuum at about 60° C.

10 parts by weight of the polybenzoxazole prepolymer prepared in the described manner are dissolved in 100 parts by volume N-methylpyrrolidone. To this solution are added 50 parts by volume glycidyl methacrylate, 0.5 parts by volume benzyldimethylamine and 0.5 parts by weight hydroquinone. After heating to a temperature of about 90° C. for 2 hours, the reaction product is precipitated from 1000 parts by volume ethanol, while stirring. After drying in a vacuum, a yellow-brown powder is obtained, which, contrary to the prepolymer, is no longer soluble in an aqueous alkaline solution. This is a clear indication that a large enough portion of phenolic hydroxyl groups has been etherified with the unsaturated epoxide. The IR spectrum (film) of the polybenzoxazole precursor stage shows bands at 950 and 1290 cm$^{-1}$, which are typical of the methacrylate grouping. These bands are missing in the spectrum of the non-photo-reactive prepolymer.

EXAMPLE II

As in Example I, a non-radiation-reactive prepolymer is prepared where, however, 4,4'-benzophenone dicarboxylic-acid dichloride (9.4 parts by weight in 30 parts by volume cyclohexanone) is used instead of isophthalic-acid dichloride. Without precipitating the prepolymer, 40 parts by volume glycidyl acrylate, 1 part by volume benzyldimethylamine and 0.5 parts by weight hydroquinone are added to the reaction solution obtained. After stirring for 12 hours and heating to about 65° C., the reaction product is precipitated from 500 parts by volume ethanol. After drying, a yellow-brown powder is obtained, which is no longer soluble in an aqueous-alkaline solution. The IR spectrum (film) shows absorption bands at 815 and 990 cm$^{-1}$, which are related to the acrylate grouping.

What is claimed is:

1. A polyoxazole precursor selected from the group consisting of an oligomeric and a polymeric precursor comprising the addition product of (a) an olefinically unsaturated 1,2-monoepoxide and (b) an hydroxyl group-containing polycondensation product of (1) a member selected from the group consisting of an aromatic dihydroxydiamino compound and a heterocyclic dihydroxydiamino compound with (2) a member selected from the group consisting of a dicarboxylic acid chloride and an ester of a dicarboxylic acid.

2. The polyoxazole precursor according to claim 1 wherein said unsaturated 1,2-monoepoxide comprises a member selected from glycidyl acrylate or glycidyl methacrylate.

3. The polyoxazole precursor according to claim 1 wherein said polycondensation product comprises the polycondensation product of 3,3'-dihydroxybenzidine and a member selected from isophthalic-acid dichloride or benzophenone dicarboxylic-acid dichloride.

4. A method for the preparation of a polyoxazole precursor comprising reacting (1) a member selected from the group consisting of an aromatic dihydroxydiamino compound and a heterocyclic dihydroxydiamino compound with (2) a member selected from a dicarboxylic acid chloride and an ester of a dicarboxylic acid to form a hydroxyl group-containing polycondensation product, and reacting said polycondensation product with an olefinically unsaturated 1,2-monoepoxide in an organic solvent at a temperature of up to about 100° C.

5. The method according to claim 4 wherein said reaction between the polycondensation product and the 1,2-monoepoxide is conducted in the presence of an amine as a catalyst.

6. A plastic coating for the optical fibers of a light waveguide comprised of the polymer precursor stage of claim 1.

* * * * *